(12) United States Patent
Yoshida et al.

(10) Patent No.: US 10,886,154 B2
(45) Date of Patent: Jan. 5, 2021

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Tatsuro Yoshida, Nagano (JP); Yoji Asahi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 267 days.

(21) Appl. No.: 15/703,328

(22) Filed: Sep. 13, 2017

(65) Prior Publication Data

US 2018/0096870 A1   Apr. 5, 2018

(30) Foreign Application Priority Data

Sep. 30, 2016   (JP) .................................. 2016-195064

(51) Int. Cl.
| | | |
|---|---|---|
| *H05B 3/68* | (2006.01) | |
| *H01L 21/67* | (2006.01) | |
| *H01L 21/683* | (2006.01) | |

(52) U.S. Cl.
CPC .. *H01L 21/67248* (2013.01); *H01L 21/67103* (2013.01); *H01L 21/67109* (2013.01); *H01L 21/6831* (2013.01); *H01L 21/6833* (2013.01)

(58) Field of Classification Search
CPC ........ H01L 21/67098–67115; H01L 21/67248; H01L 21/68757; H01L 21/68785; H01L 21/68714–68792
USPC ...................... 219/443.1–468.2; 118/724–729
See application file for complete search history.

(56) References Cited

U.S. PATENT DOCUMENTS

| | | | | |
|---|---|---|---|---|
| 4,259,123 A | * | 3/1981 | Tymkewicz | ........... G01K 1/143 136/221 |
| 6,392,205 B1 | * | 5/2002 | Minonishi | ......... H01L 21/67103 219/443.1 |
| 2002/0075624 A1 | * | 6/2002 | Wang | .................... C04B 37/006 361/234 |

(Continued)

FOREIGN PATENT DOCUMENTS

| | | |
|---|---|---|
| JP | H6-170670 | 6/1994 |
| JP | 2003-100422 | 4/2003 |

(Continued)

OTHER PUBLICATIONS

Office Action dated Nov. 19, 2019 issued with respect to the basic Japanese Patent Application No. 2016-195064 with full machine translation.

*Primary Examiner* — Sang Y Paik
(74) *Attorney, Agent, or Firm* — IPUSA, PLLC

(57) ABSTRACT

An electrostatic chuck includes a heating part, a substrate on the heating part, a temperature sensor, and an embedment part. The substrate includes a first surface onto which an object is to be attracted and held, a second surface opposite from the first surface and contacting the heating part, and a hole open at the second surface of the substrate. The hole includes a threaded inner wall surface. The temperature sensor is at the bottom of the hole. The embedment part includes a threaded side surface, and is embedded in the hole with the threaded side surface mating with the threaded inner wall surface. The substrate and the embedment part are formed of the same material.

7 Claims, 4 Drawing Sheets

(56) References Cited

U.S. PATENT DOCUMENTS

| | | | |
|---|---|---|---|
| 2004/0060925 A1* | 4/2004 | Zhou | H05B 3/143 |
| | | | 219/543 |
| 2004/0208228 A1* | 10/2004 | Hashikura | G01K 1/08 |
| | | | 374/179 |
| 2004/0244695 A1* | 12/2004 | Hashikura | H01L 21/68785 |
| | | | 118/728 |
| 2009/0022205 A1* | 1/2009 | Comendant | G01K 1/143 |
| | | | 374/161 |
| 2010/0156055 A1 | 6/2010 | Saito et al. | |
| 2011/0005686 A1* | 1/2011 | Tanaka | H01L 21/68757 |
| | | | 156/345.52 |

FOREIGN PATENT DOCUMENTS

| | | |
|---|---|---|
| JP | 2010-153490 | 7/2010 |
| JP | 2016-072478 | 5/2016 |

* cited by examiner

ELECTROSTATIC CHUCK AND SUBSTRATE FIXING DEVICE

CROSS-REFERENCE TO RELATED APPLICATION

This application is based upon and claims the benefit of priority of the prior Japanese Patent Application No. 2016-195064, filed on Sep. 30, 2016, the entire contents of which are incorporated herein by reference.

FIELD

A certain aspect of the embodiment discussed herein is related to electrostatic chucks and substrate fixing devices.

BACKGROUND

Conventional film deposition apparatuses (such as CVD apparatuses and PVD apparatuses) and plasma etching apparatuses used for manufacturing semiconductor devices such as ICs and LSIs include a stage for accurately holding a wafer in a vacuum process chamber. As such a stage, for example, a substrate fixing device that attracts and holds a wafer using an electrostatic chuck mounted on a baseplate has been proposed.

Some electrostatic chucks are provided with a heating element for controlling wafer temperature. In this case, a temperature sensor for detecting the surface temperature of the electrostatic chuck is provided in a hole formed in the electrostatic chuck, and the heating element is controlled based on the surface temperature of the electrostatic chuck monitored with the temperature sensor to control wafer temperature (see, for example, Japanese Laid-open Patent Publication No. 2016-72478).

SUMMARY

According to an aspect of the present invention, an electrostatic chuck includes a heating part, a substrate on the heating part, a temperature sensor, and an embedment part. The substrate includes a first surface onto which an object is to be attracted and held, a second surface opposite from the first surface and contacting the heating part, and a hole open at the second surface of the substrate. The hole includes a threaded inner wall surface. The temperature sensor is at the bottom of the hole. The embedment part includes a threaded side surface, and is embedded in the hole with the threaded side surface mating with the threaded inner wall surface. The substrate and the embedment part are formed of the same material.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
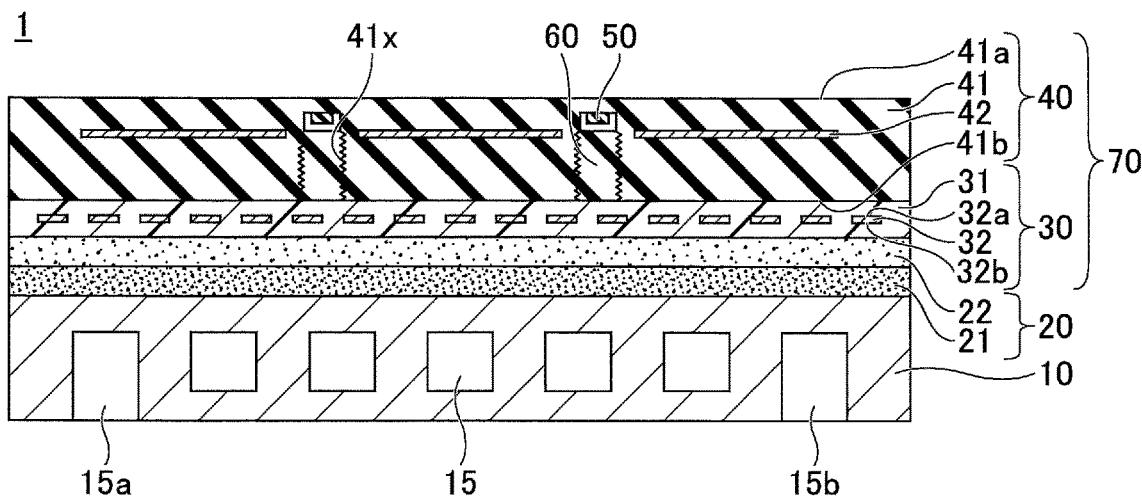
FIGS. 1A through 1D are diagrams schematically depicting a substrate fixing device according to an embodiment.

According to the above-described structure where a temperature sensor for detecting the surface temperature of an electrostatic chuck is provided in a hole formed in the electrostatic chuck, a resin may fill in the hole to cover the temperature sensor. In this case, there is a mismatch in the coefficient of thermal expansion between the material of the electrostatic chuck (such as a ceramic) and the resin. Therefore, when the electrostatic chuck is used at high temperatures, cracks may be caused in members around the resin.

According to an aspect of the present invention, cracks are less likely to be caused in members of an electrostatic chuck when the electrostatic chuck is used at high temperatures.

One or more preferred embodiments of the present invention will be explained with reference to accompanying drawings. In the following, the same elements or components are referred to using the same reference numeral, and duplicate description thereof may be omitted.

[Structure of Substrate Fixing Device]

Figure 1B:
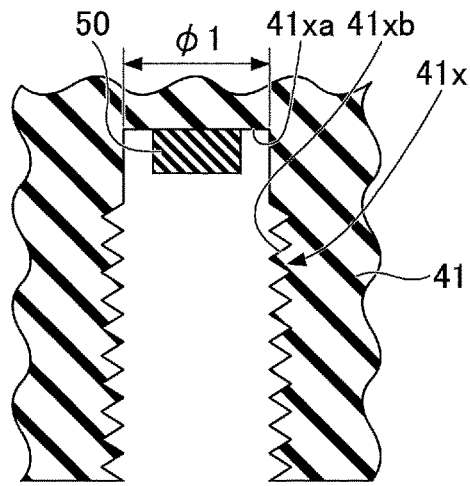
Figure 1C:
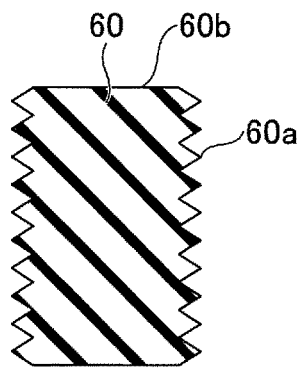
Figure 1D:
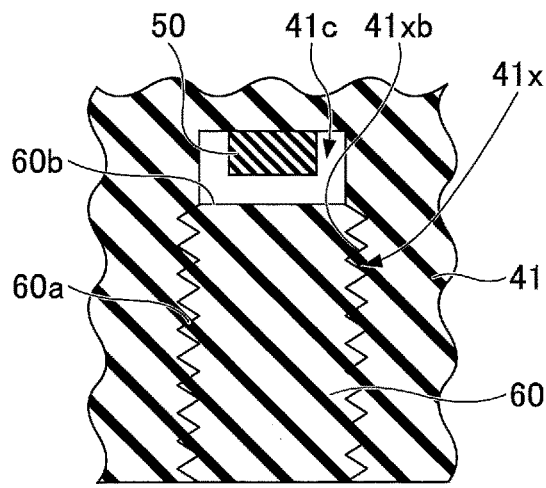

FIGS. 1A through 1D are diagrams schematically depicting a substrate fixing device according to an embodiment. FIG. 1A is a cross-sectional view of the entirety of the substrate fixing device, and FIGS. 1B through 1D are enlarged cross-sectional views of a hole and an embedment part. FIG. 1B depicts the hole, FIG. 1C depicts the embedment part, and FIG. 1D depicts the embedment part and the hole that are threadedly connected together.

Referring to FIGS. 1A through 1D, a substrate fixing device 1 according to this embodiment includes a baseplate 10, an adhesive layer 20, and an electrostatic chuck 70.

The baseplate 10 is a member for mounting the electrostatic chuck 70. The thickness of the baseplate 10 may be, for example, approximately 20 mm to approximately 50 mm. The baseplate 10 is formed of, for example, aluminum, and may also be used as, for example, an electrode for controlling plasma. By feeding the baseplate 10 with predetermined high-frequency electric power, it is possible to control energy for causing, for example, generated ions in the state of plasma to collide with a wafer attracted onto the electrostatic chuck 70 to effectively perform etching.

A water conduit 15 is provided in the baseplate 10. The water conduit 15 includes a cooling water introduction part 15a at one end and a cooling water discharge part 15b at the other end. The water conduit 15 is connected to a cooling water controller (not depicted) provided outside the substrate fixing device 1. The cooling water controller introduces cooling water into the water conduit 15 from the cooling water introduction part 15a and discharges the cooling water from the cooling water discharge part 15b. By cooling the baseplate 10 by circulating cooling water through the water conduit 15, it is possible to cool a wafer attracted onto the electrostatic chuck 70. In addition to the water conduit 15, for example, a gas conduit for introducing an inert gas for cooling a wafer attracted onto the electrostatic chuck 70 may be provided in the baseplate 10.

The electrostatic chuck 70 is firmly adhered onto the baseplate 10 through the adhesive layer 20. The adhesive layer 20 may have, for example, a two-layer structure of a first layer 21 and a second layer 22. For example, a silicone adhesive may be used as the first layer 21 and the second layer 22. The thickness of each of the first layer 21 and the second layer 22 may be, for example, approximately 1 mm. The thermal conductivity of the first layer 21 and the second layer 22 is preferably 2 W/mK or higher. The adhesive layer 20 may be formed of a single layer. By combining an adhesive having a high thermal conductivity and an adhesive having a low elastic modulus to form a two-layer structure, however, it is possible to achieve a stress reduction effect to reduce stress generated from a difference in thermal expansion between the aluminum baseplate 10 and the electrostatic chuck 70.

The electrostatic chuck 70 includes a heating part 30, an attraction and holding part 40, temperature sensors 50, and embedment parts 60, and attracts and holds a wafer that is an object to be attracted and held (hereinafter "attraction object"). The wafer may be, for example, approximately 8 in., approximately 12 in., or approximately 18 in. in diameter. The electrostatic chuck 70 is, for example, a Johnsen-Rahbek electrostatic chuck. Alternatively, the electrostatic chuck 70 may be a Coulombic electrostatic chuck.

The attraction and holding part 40 includes a first surface onto which an attraction object is to be attracted and held and a second surface opposite from the first surface. The heating part 30 is provided on the second surface of the attraction and holding part 40. The heating part 30 includes an insulating layer 31 and a heating element 32 buried in the insulating layer 31. The heating element 32 is surrounded and covered by the insulating layer 31 for external protection. As the heating element 32, a rolled alloy is preferably used. By using a rolled alloy as the heating element 32, it is possible to reduce variations in the thickness of the heating element 32 to improve the distribution of generated heat. The heating element 32 does not necessary have to be buried in the center of the insulating layer 31 in its thickness direction. The heating element 32 may be offset from the center of the insulating layer 31 in its thickness direction toward the baseplate 10 or the attraction and holding part 40 in accordance with required specifications.

The resistivity of the heating element 32 is preferably 10 $\mu\Omega$/cm to 70 $\mu\Omega$/cm, and more preferably, 10 $\mu\Omega$/cm to 50 $\mu\Omega$/cm. Conventional substrate fixing devices employ a NiCr heating element whose resistivity is approximately 100 $\mu\Omega$/cm. Therefore, in the case of designing 20$\Omega$ to 50$\Omega$ wiring, the heating element becomes approximately 1 mm to approximately 2 mm in wiring width and approximately 50 $\mu$m in thickness, thus making it difficult to form a fine pattern of the heating element. By causing the resistivity of the heating element 32 to be 10 $\mu\Omega$/cm to 70 $\mu\Omega$/cm, which is lower than the resistivity of the NiCr heating element, the pattern of the heating element 32 can be finer than conventionally in the case of designing the same 20$\Omega$ to 50$\Omega$ wiring. When the resistivity of the heating element 32 is less than 10 $\mu\Omega$/cm, the generation of heat by the heating element 32 becomes insufficient. Accordingly, a resistivity of less than 10 $\mu\Omega$/cm is not preferable.

Suitable materials of rolled alloys for the heating element 32 include, for example, CN49 (constantan) (a Cu—Ni—Mn—Fe alloy), zeranin (a Cu—Mn—Sn alloy), and manganin (a Cu—Mn—Ni alloy). The resistivity of CN49 (constantan) is approximately 50 $\mu\Omega$/cm. The resistivity of zeranin is approximately 29 $\mu\Omega$/cm. The resistivity of manganin is approximately 44 $\mu\Omega$/cm. The thickness of the heating element 32 is preferably 60 $\mu$m or less in view of wiring formability by etching.

Suitable materials for the insulating layer 31 include, for example, an epoxy resin and a bismaleimide-triazine resin having a high thermal conductivity and high heat resistance. The thermal conductivity of the insulating layer 31 is preferably 3 W/mK or higher. By including a filler such as alumina or aluminum nitride in the insulating layer 31, it is possible to improve the thermal conductivity of the insulating layer 31. The glass-transition temperature (Tg) of the insulating layer 31 is preferably 250° C. or higher. The thickness of the insulating layer 31 is preferably approximately 100 $\mu$m to approximately 150 $\mu$m. The thickness variation of the insulating layer 31 is preferably ±10% or less.

In order to improve the adhesion between the heating element 32 and the insulating layer 31 at high temperatures, at least one surface of the heating element 32, namely, one or both of an upper surface 32a and a lower surface 32b of the heating element 32, are preferably roughened. In the case of roughening both the upper and lower surfaces 32a and 32b of the heating element 32, the roughening method may differ between the upper surface 32a and the lower surface 32b. The roughening method may be, but is not limited in particular to, for example, etching, surface modification using a coupling agent, or dot processing using a UV-YAG laser at a wavelength of 355 nm or less.

The attraction and holding part 40 includes a substrate 41 and an electrostatic electrode 42. A first surface 41a (an attraction object placement surface) of the substrate 41 forms the first surface of the attraction and holding part 40, and receives an attraction object. A second surface 41b of the substrate 41, opposite from the first surface 41a, forms the second surface of the attraction and holding part 40, and contacts the heating part 30. The substrate 41 is a dielectric. Suitable materials for the substrate 41 include, for example, ceramics such as aluminum oxide ($Al_2O_3$) and aluminum nitride (AlN). The thickness of the substrate 41 may be, for example, approximately 1 mm to approximately 10 mm. The relative permittivity (at 1 kHz) of the substrate 41 may be, for example, approximately 9 to approximately 10.

The attraction and holding part 40 (the substrate 41) and the insulating layer 31 of the heating part 30 are directly bonded. By directly bonding the heating part 30 and the attraction and holding part 40 without interposing an adhesive, which is low in heat resistance, between the heating part 30 and the attraction and holding part 40, it is possible to increase the heatproof temperature of the substrate fixing device 1. The heatproof temperature of conventional substrate fixing devices in which a heating part and an attraction and holding part are bonded using an adhesive is approximately 150° C., while the heatproof temperature of the substrate fixing device 1 can be approximately 200° C.

The electrostatic electrode 42 is a thin-film electrode buried in the substrate 41. The electrostatic electrode 42 is connected to a power supply disposed outside the substrate fixing device 1. When a predetermined voltage is applied to the electrostatic electrode 42, an electrostatic attraction force is generated between the electrostatic electrode 42 and a wafer. As a result, the wafer can be attracted and held onto the attraction and holding part 40. The attraction and holding force increases as the voltage applied to the electrostatic electrode 42 increases. The electrostatic electrode 42 may have either a monopolar shape or a bipolar shape. Suitable materials for the electrostatic electrode 42 include, for example, tungsten and molybdenum.

Holes 41x that are open toward the heating part 30 are provided in the substrate 41. The planar shape of the holes 41x may be, for example, a circle. The diameter $\phi 1$ of the holes 41x may be, for example, approximately 1 mm to approximately 5 mm. Hereinafter, the holes 41x may be collectively referred to as "hole 41x" where a description is common to the holes 41x.

In this specification, a plan view refers to a view of an object from a direction normal to the first surface 41a of the substrate 41, and may be a view in the thickness direction of the substrate 41. Furthermore, a planar shape refers to the shape of an object viewed from a direction normal to the first surface 41a of the substrate 41.

The temperature sensors 50 are provided one at the bottom (on a bottom surface 41xa) of each hole 41x. The temperature sensors 50 may be hereinafter collectively referred to as "temperature sensor 50" where a description is common to the temperature sensors 50. The temperature sensor 50 detects the surface temperature (the temperature of the first surface) of the electrostatic chuck 70, and may output a detection result to the outside of the substrate fixing device 1 via a wiring line (not depicted). For example, a thermistor or a diode may be used as the temperature sensor 50. The temperature sensor 50 may be, for example, approximately 0.5 mm square to approximately a few millimeters square in size. The diameter ϕ1 of the hole 41x may be suitably determined in accordance with the size of the temperature sensor 50. To increase the accuracy of detection of the surface temperature of the electrostatic chuck 70, it is preferable to reduce the distance between the bottom surface 41xa of the hole 41x and the first surface of the electrostatic chuck 70.

The embedment parts 60 are embedded one in each hole 41x. To be more specific, an inner wall surface 41xb of the hole 41x is threaded for a certain distance from the edge of the opening of the hole 41x to form an internal thread. A side surface 60a of the embedment part 60 is threaded to form an external thread. The embedment part 60 is threadedly connected to the hole 41x. A gap is formed between an end 60b of the embedment part 60 and the temperature sensor 50 in consideration of the coefficient of thermal expansion of the embedment part 60 to prevent the end 60b of the embedment part 60 from contacting the temperature sensor 50. Thus, the temperature sensor 50 is placed in a space 41c (an air layer) formed in the substrate 41. The space 41c is aligned with the embedment part 60 in the thickness direction of the substrate 41.

To eliminate a mismatch in the coefficient of thermal expansion between members, the embedment part 60 is formed of the same material as the material of the substrate 41. For example, when the material of the substrate 41 is aluminum oxide, the embedment part 60 is formed of aluminum oxide, and when the material of the substrate 41 is aluminum nitride, the embedment part 60 is formed of aluminum nitride.

The number of sets of the hole 41x, the temperature sensor 50, and the embedment part 60 is not limited to two, and may be suitably determined as required. The electrostatic chuck 70 may be divided into multiple zones in a plan view, and the heating element 32 may be provided zone by zone to control the temperature of each zone independently. In this case, it is preferable to provide the hole 41x and dispose the temperature sensor 50 and the embedment part 60 zone by zone.

[Method of Manufacturing Substrate Fixing Device]

FIGS. 2A through 2H are diagrams illustrating a process of manufacturing a substrate fixing device according to this embodiment. A process of manufacturing the substrate fixing device 1 is described with reference to FIGS. 2A through 2H. In FIGS. 2A through 2G, the view is inverted compared with FIGS. 1A through 1D.

Figure 2A:
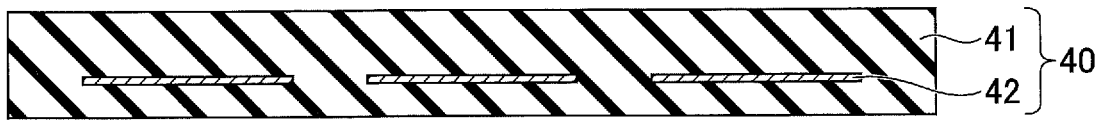
FIGS. 2A through 2H are diagrams illustrating a process of manufacturing a substrate fixing device according to the embodiment.

First, in the process depicted in FIG. 2A, the attraction and holding part 40 including the substrate 41 and the electrostatic electrode 42 buried in the substrate 41 is formed by a known manufacturing method that includes the process of forming a via in a green sheet, the process of filling the via with conductive paste, the process of forming a pattern to become an electrostatic electrode, the process of stacking another green sheet on the green sheet and performing firing, and the process of performing surface planarization. In order to increase adhesion to an insulating resin film 311, a surface of the attraction and holding part 40 to be laminated with the insulating resin film 311 may be subjected to, for example, blasting to be roughened.

Figure 2B:
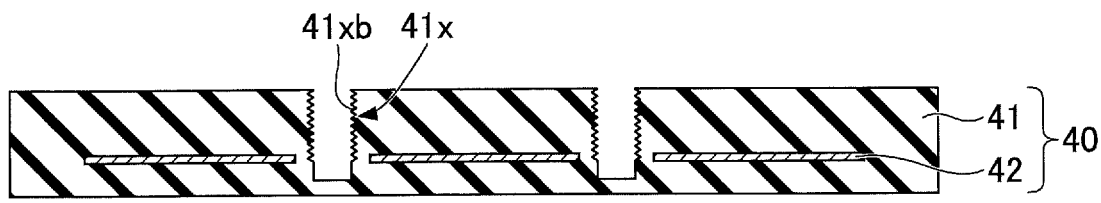

Next, in the process depicted in FIG. 2B, the hole 41x is formed in the substrate 41 by, for example, drilling. An internal thread is famed in part of the inner wall surface 41xb of the hole 41x on the heating part 30 side (an upper part of the inner wall surface 41xb in FIG. 2B) using, for example, a tap. The shape of the hole 41x is as described above.

Figure 2C:
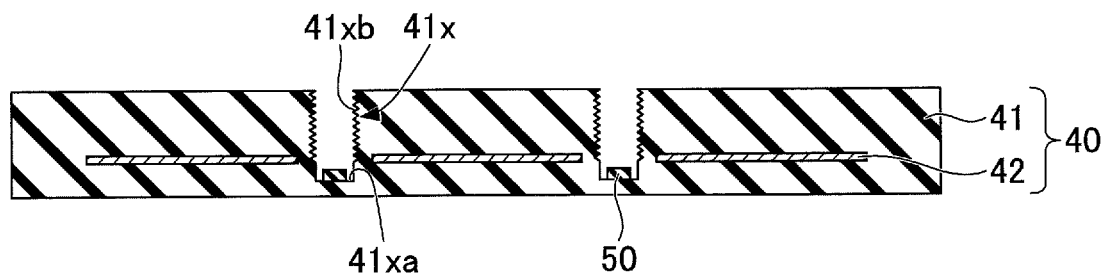

Next, in the process depicted in FIG. 2C, the temperature sensor 50 such as a thermistor is fixed to the bottom surface 41xa of the hole 41x. The temperature sensor 50 is connected to a wiring line (not depicted) by, for example, solder to output a detection result to the outside.

Figure 2D:
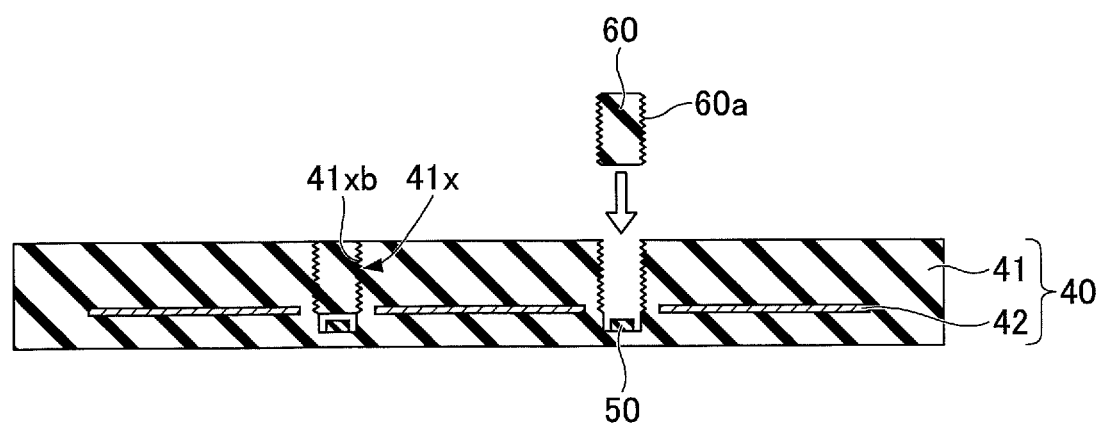

Next, in the process depicted in FIG. 2D, the embedment part 60 is formed of the same material as the substrate 41 of the attraction and holding part 40, and an external thread is formed on the side surface 60a of the embedment part 60 using, for example, a die. Then, the embedment part 60 is threadedly connected to the hole 41x. That is, the embedment part 60 is embedded in the hole 41x with the threaded side surface 60a mating with the threaded inner wall surface 41xb. At this point, the position of the embedment part 60 is adjusted to prevent the embedment part 60 from contacting the temperature sensor 50.

Figure 2E:
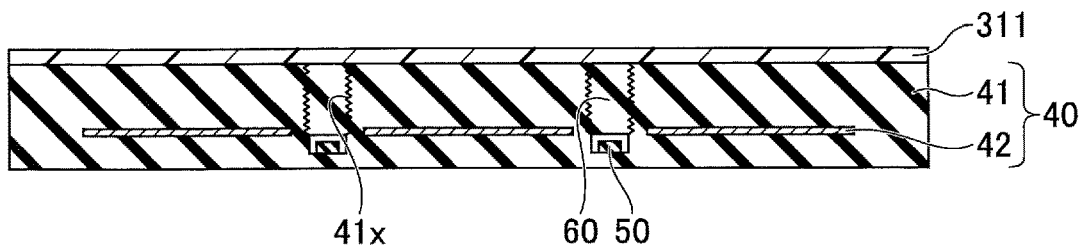

Next, in the process depicted in FIG. 2E, the attraction and holding part 40 is directly laminated with the insulating resin film 311. Laminating the attraction and holding part 40 with the insulating resin film 311 in a vacuum, which makes it possible to prevent inclusion of voids, is preferable. The insulating resin film 311 is left semi-cured (in B-stage) without being completely cured. Because of the adhesive force of the semi-cured insulating resin film 311, the insulating resin film 311 is temporarily fixed onto the attraction and holding part 40.

Suitable materials for the insulating resin film 311 include, for example, an epoxy resin and a bismaleimide-triazine resin having a high thermal conductivity and high heat resistance. The thermal conductivity of the insulating resin film 311 is preferably 3 W/mK or higher. By including a filler such as alumina or aluminum nitride in the insulating resin film 311, it is possible to improve the thermal conductivity of the insulating resin film 311. The glass-transition temperature of the insulating resin film 311 is preferably 250° C. or higher. In terms of improving heat transfer performance (increasing the rate of heat transfer), the thickness of the insulating resin film 311 is preferably 60 μm or less, and the thickness variation of the insulating resin film 311 is preferably ±10% or less.

Figure 2F:
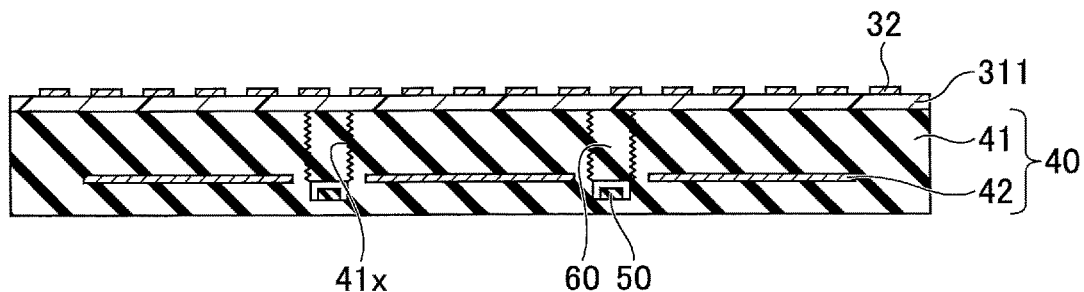

Next, in the process depicted in FIG. 2F, the pattern of the heating element 32 is formed on the insulating resin film 311. The pattern of the heating element 32 may be formed by, for example, placing metal foil on the insulating resin film 311 and patterning the metal foil by photolithography. Suitable materials for the metal foil include a rolled alloy illustrated by way of example as a material for the heating element 32. In view of wiring formability by etching, the thickness of the metal foil is preferably 60 μm or less. Because of the adhesive force of the semi-cured insulating resin film 311, the metal foil is temporarily fixed onto the insulating resin film 311.

Before placement of the metal foil on the insulating resin film 311, it is preferable to roughen at least one surface (one or both of the upper and the lower surface) of the metal foil. In the case of roughening both the upper and the lower surface of the metal foil, the roughening method may differ between the upper and the lower surface. The roughening method may be, but is not limited in particular to, for example, etching, surface modification using a coupling agent, or dot processing using a UV-YAG laser at a wavelength of 355 nm or less.

According to dot processing, it is possible to selectively roughen a region of the metal foil that requires roughening. Therefore, in the case of using dot processing, there is no need to roughen the entire region of the metal foil, and it is sufficient to roughen at least a region of the metal foil to be left as the heating element 32 (that is, there is no need to go so far as to roughen a region of the metal foil to be removed by etching).

By forming the heating element 32 by photolithography, it is possible to reduce variations in the size of the heating element 32 in its width direction to improve the distribution of generated heat. The heating element 32 formed by etching may have, for example, a substantially trapezoidal cross-sectional shape. In this case, the difference in width between opposite surfaces of the heating element 32 of which one contacts the insulating resin film 311 may be, for example, approximately 10 μm to approximately 50 μm. By causing the heating element 32 to have a simple substantially trapezoidal cross-sectional shape, it is possible to improve the distribution of generated heat.

Figure 2G:
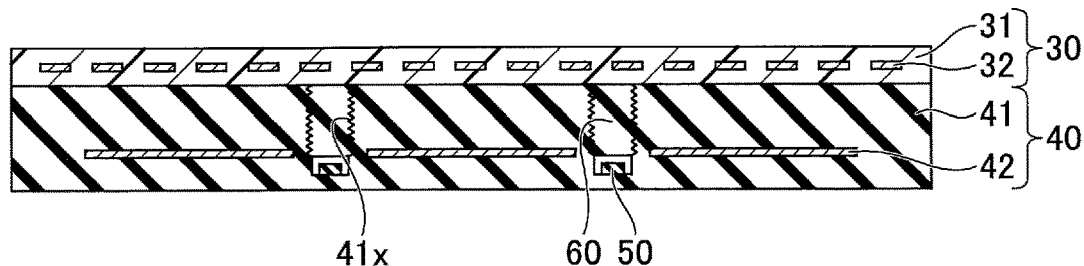

Next, in the process depicted in FIG. 2G, the insulating layer 31 is formed. For example, the insulating layer 31 may be formed as follows. The insulating resin film 311 is laminated with another insulating resin film to cover the heating element 32, and the insulating resin film 311 and the other insulating resin film are heated to or above a curing temperature to be cured while being pressed toward the attraction and holding part 40. As a result, the insulating resin film 311 and the other insulating resin film are combined together as one piece into the insulating layer 31. Consequently, the heating part 30 in which the heating element 32 is surrounded and covered by the insulating layer 31 is formed, and the insulating layer 31 of the heating part 30 and the attraction and holding part 40 are directly bonded. It is preferable to heat the insulating resin film 311 and the other insulating resin film at or below a temperature of 200° C. in view of stress to be caused when the temperature returns to normal temperature.

By heating and curing the insulating resin film 311 and the other insulating resin film while pressing the insulating resin film 311 and the other insulating resin film against the attraction and holding part 40, it is possible to flatten the upper surface (a surface opposite from a surface that contacts the attraction and holding part 40) of the insulating layer 31 by reducing irregularities in the upper surface due to the presence or absence of the heating element 32. The size of irregularities in the upper surface of the insulating layer 31 is preferably 7 μm or less. By causing the size of irregularities in the upper surface of the insulating layer 31 to be 7 μm or less, it is possible to prevent air bubbles from being caught between the insulating layer 31 and the adhesive layer 20 (the second layer 22) in the subsequent process. That is, it is possible to prevent a decrease in the adhesion between the insulating layer 31 and the adhesive layer 20 (the second layer 22).

Figure 2H:
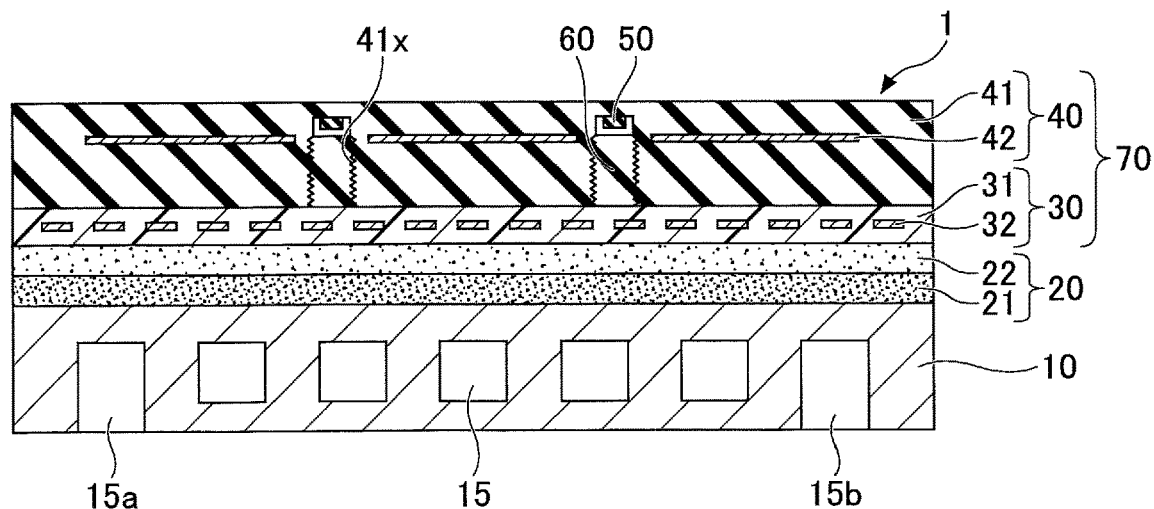

Next, in the process depicted in FIG. 2H, the baseplate 10 in which the water conduit 15, etc., are preformed is prepared, and the first layer 21 and the second layer 22 are successively stacked in this order on the baseplate 10 to form the adhesive layer 20 (uncured). Then, the structure depicted in FIG. 2G is inverted to be placed on the baseplate 10 through the adhesive layer 20, and the adhesive layer 20 is cured. As a result, the substrate fixing device 1 in which the electrostatic chuck 70 is stacked on the baseplate 10 through the adhesive layer 20 is completed.

Figure 3:
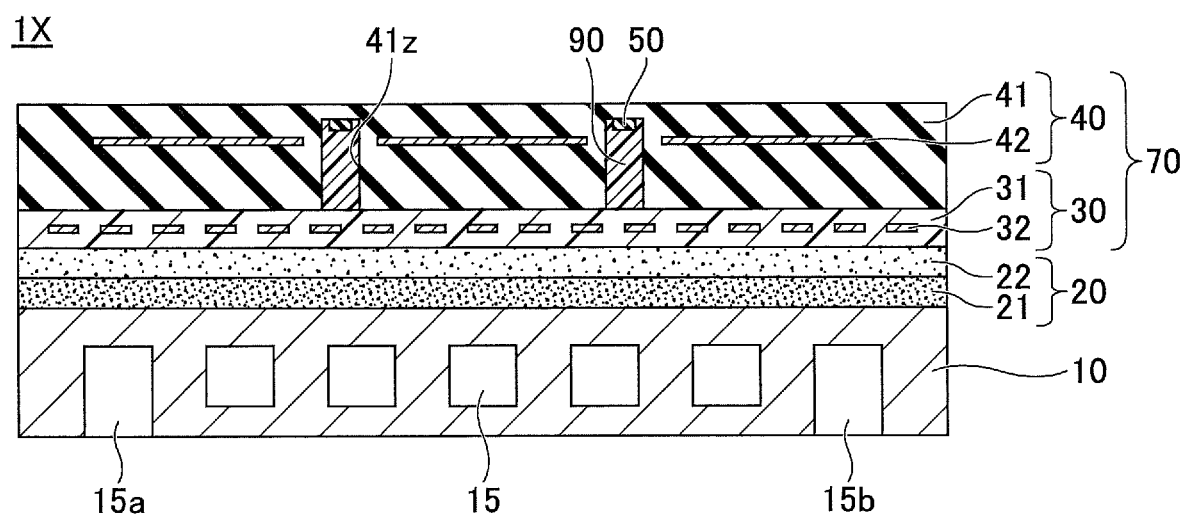
FIG. 3 is a schematic cross-sectional view of a substrate fixing device according to a comparative example.

Effects specific to the substrate fixing device 1 are described with reference to a comparative example. FIG. 3 is a cross-sectional view of a substrate fixing device according to a comparative example. Referring to FIG. 3, a substrate fixing device 1X is different from the substrate fixing device 1 (see FIGS. 1A through 1D) in that holes 41z (hereinafter collectively referred to as "hole 41z" for convenience of description) formed in the substrate 41 are filled with a resin 90.

The hole 41z is open toward the heating part 30. The planar shape of the hole 41z is, for example, a circle that is approximately 1 mm to approximately 5 mm in diameter. The resin 90 fills in the entirety of the hole 41z to cover the temperature sensor 50. For example, a thermosetting resin or a thermoplastic resin may be used as the resin 90.

According to the substrate fixing device 1X, there is a mismatch in the coefficient of thermal expansion between the material of the substrate 41 (a ceramic such as aluminum oxide or aluminum nitride) and the resin 90. Therefore, when the substrate fixing device 1X is used at high temperatures, the resin 90 may expand to cause cracks in the insulating layer 31 or the heating element 32 around the resin 90. This problem becomes conspicuous particularly when the heating element 32 is immediately below the resin 90. Forming no heating element 32 immediately below the resin 90, however, would create a region without the heating element 32 in the heating part 30, thus causing an uneven temperature distribution in the attraction and holding part 40.

In contrast, according to the substrate fixing device 1, the embedment part 60 is formed of the same material as the material of the substrate 41. Therefore, there is no mismatch in the coefficient of thermal expansion between the embedment part 60 and the substrate 41. As a result, the generation of cracks in the insulating layer 31 or the heating element 32 around the embedment part 60 can be prevented even when the substrate fixing device 1 is used at high temperatures.

Furthermore, according to the substrate fixing device 1, it is possible to form the heating element 32 immediately below the embedment part 60 (namely, at a position that overlaps the embedment part 60 in a plan view). This makes it possible to place the heating element 32 evenly with respect to the entirety of the attraction and holding part 40, thus making it possible to make an uneven temperature distribution less likely to occur in the attraction and holding part 40.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, examples of objects to be attracted and held by a substrate fixing device according to embodiments of the present invention include, in addition to semiconductor wafers (such as silicon wafers), glass substrates used in the process of manufacturing, for example, liquid crystal panels.

What is claimed is:

1. An electrostatic chuck comprising:
a heating part including a heating element;
a substrate on the heating part,
the substrate including
a first surface onto which an object is to be attracted and held, and a second surface opposite from the first surface and contacting the heating part; and
a hole open at the second surface of the substrate, the hole including a threaded inner wall surface;
a temperature sensor at a bottom of the hole; and
an embedment part including a threaded side surface, and embedded in the hole with the threaded side surface mating with the threaded inner wall surface,
wherein the substrate and the embedment part are formed of a same material,
wherein the embedment part and the heating part are directly bonded, and
wherein the heating element overlaps the embedment part when viewed in a thickness direction of the substrate.

2. The electrostatic chuck as claimed in claim 1, wherein the heating element includes at least one roughened surface, and
the heating part further includes an insulating layer encapsulating the heating element, and directly bonded to the substrate.

3. The electrostatic chuck as claimed in claim 1, wherein there is a space between the temperature sensor and the embedment part.

4. A substrate fixing device comprising:
a baseplate; and
the electrostatic chuck as set forth in claim 1 on the baseplate.

5. An electrostatic chuck comprising:
a heating part including a heating element;
a substrate on the heating part, the substrate including
an electrostatic electrode;
a first surface onto which an object is to be attracted and held, and a second surface opposite from the first surface and contacting the heating part; and
a hole open at the second surface of the substrate, the hole including a threaded inner wall surface;
a temperature sensor at a bottom of the hole; and
an embedment part including a threaded side surface, and embedded in the hole with the threaded side surface mating with the threaded inner wall surface,
wherein the substrate and the embedment part are formed of a same material,
wherein the bottom of the hole is closer to the first surface of the substrate than is the electrostatic electrode, and
wherein the heating element overlaps the embedment part when viewed in a thickness direction of the substrate.

6. The electrostatic chuck as claimed in claim 5, wherein the bottom of the hole is closer to the first surface of the substrate than to the second surface of the substrate.

7. A substrate fixing device comprising:
a baseplate; and
the electrostatic chuck as set forth in claim 5 on the baseplate.

* * * * *